(12) United States Patent
Lucke et al.

(10) Patent No.: US 7,236,367 B2
(45) Date of Patent: Jun. 26, 2007

(54) POWER ELECTRONICS COMPONENT

(75) Inventors: Olaf Lucke, Frankfurt/Main (DE);
Bernd Thyzel, Glashuetten (DE)

(73) Assignee: Siemens Aktiengesellschaft, München (DE)

( * ) Notice: Subject to any disclaimer, the term of this patent is extended or adjusted under 35 U.S.C. 154(b) by 249 days.

(21) Appl. No.: 10/487,895

(22) PCT Filed: Aug. 29, 2002

(86) PCT No.: PCT/DE02/03178

§ 371 (c)(1),
(2), (4) Date: Feb. 26, 2004

(87) PCT Pub. No.: WO03/026009

PCT Pub. Date: Mar. 27, 2003

(65) Prior Publication Data

US 2004/0264140 A1  Dec. 30, 2004

(30) Foreign Application Priority Data

Aug. 31, 2001  (DE) ................................ 101 42 615

(51) Int. Cl.
*H05K 7/20* (2006.01)
*H01L 23/34* (2006.01)
(52) U.S. Cl. .................... 361/717; 361/718; 257/717
(58) Field of Classification Search ........ 361/717–719, 361/722; 227/334, 318; 257/717
See application file for complete search history.

(56) References Cited

U.S. PATENT DOCUMENTS

| 4,237,086 | A | * | 12/1980 | Gehle ......................... 264/130 |
| 5,159,532 | A | | 10/1992 | Kilian et al. |
| 5,446,318 | A | | 8/1995 | Koike et al. |
| 5,465,898 | A | | 11/1995 | Schulz-Harder et al. |
| 5,585,672 | A | | 12/1996 | Koike et al. |
| 5,644,327 | A | * | 7/1997 | Onyskevych et al. ......... 345/80 |
| 5,736,786 | A | * | 4/1998 | Sankaran et al. ........... 257/717 |
| 6,033,787 | A | * | 3/2000 | Nagase et al. .............. 428/545 |
| 6,219,247 | B1 | | 4/2001 | Haupt et al. |
| 6,570,773 | B1 | | 5/2003 | Loibl et al. |

FOREIGN PATENT DOCUMENTS

| DE | 38 37 975 A1 | 5/1990 |
| DE | 43 30 070 A1 | 3/1994 |
| DE | 43 18 061 A1 | 1/1995 |
| DE | 198 37 663 C2 | 3/2000 |

(Continued)

*Primary Examiner*—Anatoly Vortman
(74) *Attorney, Agent, or Firm*—Cohen Pontani Lieberman & Pavane LLP

(57) ABSTRACT

The invention relates to a power electronics component that comprises a planar ceramics substrate (2) on whose one face condutor tracks (6), applied in thick-film technique, are disposed for electrically connecting electrical power components (7) of a circuit that are also disposed on the ceramics substrate (2). The ceramics substrate (2), with its other face, is brazed onto a metal a metal support element (1) that serves as a heat spreader. The support element (1) is linked with a thermoconducting housing part housing that accommodates the support element (1) in a thermoconductive manner. On the face of the support element (1) facing away from the ceramics substrate (2), approximately opposite the ceramics substrate (2), a second ceramics substrate (4) is brazed onto the ceramics substrate (2) that carries the circuit and has approximately the same dimensions.

16 Claims, 1 Drawing Sheet

FOREIGN PATENT DOCUMENTS

| | | |
|---|---|---|
| DE | 199 07 949 A1 | 9/2000 |
| EP | 1 089 334 A2 | 4/2001 |
| JP | 08083867 | 3/1996 |
| JP | 11236278 | 8/1999 |
| JP | 2000332170 A | 11/2000 |

* cited by examiner

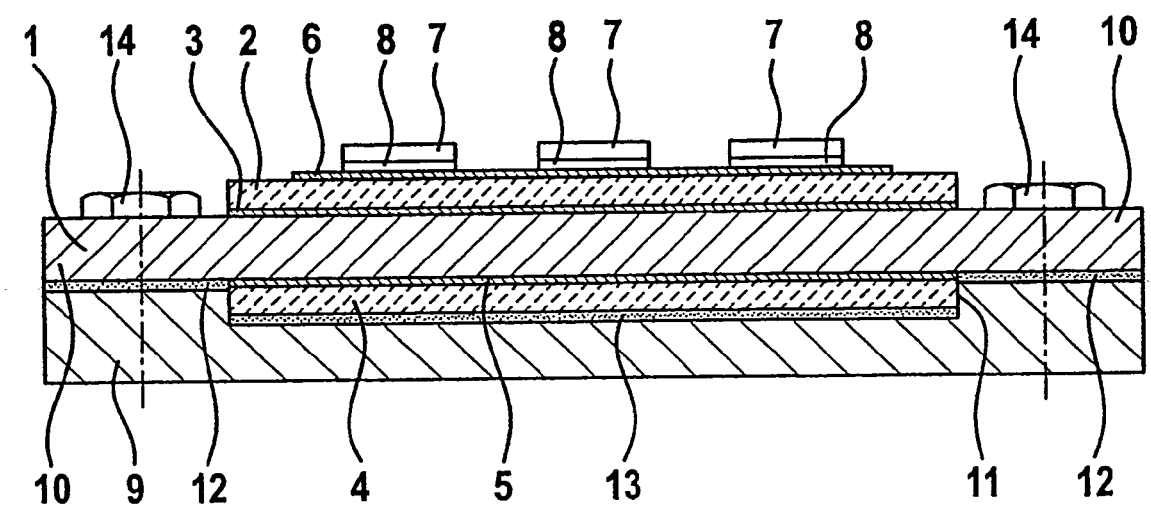

POWER ELECTRONICS COMPONENT

PRIORITY CLAIM

This is a U.S. national stage of application No. PCT/DE02/03 178, filed on 29 Aug. 2002. Priority is claimed on that application and on the following application(s): Country: Germany, Application No.: 101 42 615.1, Filed: 31 Aug. 2001.

BACKGROUND OF THE INVENTION

1. Field of the Invention

The invention relates to a power electronics unit, in particular for a control device in a motor vehicle, with a planar ceramic substrate, on one side of which conductor tracks are provided using the thick-film technique for electrically connecting electrical power components of a circuit that are likewise arranged on the ceramic substrate and which is brazed by its other side onto a metal support element serving as a heat spreader, the support element being connected in a thermally conducting manner to a thermally conducting housing component of a housing accommodating the support element.

2. Description of the Prior Art

With power electronics units there is the problem that the electrical power components generate heat, which has to be removed. For this purpose, it is known to form the support element as a planar ceramic substrate, on which conductor tracks are provided using a thick-film technique, and the electrical power components and any control components there may be are connected to the conductor tracks by soft soldering. The ceramic substrate is brazed to a metal support element, which serves as a heat spreader and is connected to a thermally conducting housing component by means of an adhesive.

On account of the different coefficients of expansion of the support element and the ceramic substrate, these components deform to differing degrees, which can have the effect during cooling after brazing that the ceramic substrate is damaged and later the soft-solder connections between the conductor tracks and the electrical power components are possibly also damaged.

SUMMARY OF THE INVENTION

The object of the invention is therefore to provide a power electronics unit of the type stated at the beginning which ensures good heat removal of the heat generated by the electrical power components and with which instances of damage caused by the different coefficients of expansion of the materials of the ceramic substrate and the support element are avoided.

This object is achieved according to the invention by brazing onto the side of the support element that is facing away from the ceramic substrate, approximately opposite from said ceramic substrate, a second ceramic substrate of approximately the same dimensions as the ceramic substrate bearing the circuit.

By brazing approximately identical ceramic substrates onto both sides of the support element, approximately identical, but opposing thermal stresses are produced from both sides of the support element, compensating one another at least to a great extent and so avoiding thermal-stress-induced damage to the ceramic substrate bearing the circuit. In this case, the brazing of the two ceramic substrates is performed as far as possible without interim cooling.

The form according to the invention has the further effect that there is very good dissipation of the heat generated by the electrical power components, since this heat is transferred very well via the brazed connection from the ceramic substrate to the support element, which has good thermal conduction and serves as a heat spreader, and is distributed there over a relatively large surface area before the further heat removal to the housing component and to the surroundings takes place. A reduction of the heat removal caused by an adhesive bond with respect to the housing component is avoided.

The support element may consist of aluminum, the heat removal being improved further by it being formed from pure aluminum, on account of its higher thermal conductivity.

If in this case both ceramic substrates have a layer of thick-film material on their surface area that is to be brazed, with nickel plating on the free surfaces of said layer, the high temperatures of the brazing processes do not impair the support element made of aluminum, which has a relatively low melting point.

Even more favorable heat removal, and consequently heat spreading, are obtained if the support element consists of copper, which has a very high thermal conductivity.

One or both ceramic substrates may consist of $Al_2O_3$.

To obtain optimum heat transfer from the ceramic substrate to the support element, the ceramic substrates may be connected to the support element by brazing over their entire surface areas, at least to a great extent.

A connection which is both simple and has good heat conduction is achieved by the support element having a greater surface area extent than the ceramic substrates and being connected to the housing component by its regions that protrude beyond the ceramic substrates resting entirely or partly flat against it.

In order also to use the surface area of the second ceramic substrate for dissipating the heat of the electrical power components, the second ceramic substrate may be in contact with the housing component by its side that is facing away from the support element resting flat against it.

For easy mounting of the support element bearing a ceramic substrate on both sides, the second ceramic substrate may protrude into a recess of the housing component corresponding approximately to its dimensions.

The heat transfer from the second ceramic substrate to the housing component is improved still further if a layer of thermally conductive paste is arranged between the second ceramic substrate and the housing component.

An arrangement of the support element on the housing component that is both secure and can be simply carried out is achieved by the support element being arranged on the housing component by means of fastening elements, it being possible for the support element to be fastened on the housing component in a simple manner by means of screws.

In addition, a layer of thermally conductive paste may be arranged between the support element and the housing component, further improving the heat transfer from the support element to the housing component.

To achieve particularly good heat removal to the surroundings, the housing component may be an outer wall of the housing.

If the heat that is generated by the electrical power components and is to be removed is particularly great, the housing component may be a wall of the housing that can be subjected to a cooling agent.

BRIEF DESCRIPTION OF THE DRAWINGS

An exemplary embodiment of the invention is represented in the drawing and described in more detail below. The single FIGURE of the drawing shows a cross section of a power electronics unit.

DETAILED DESCRIPTION OF THE PREFERRED EMBODIMENTS

The power electronics unit represented has a rectangular support element 1 made of pure aluminum, on the upper side of which a first planar ceramic substrate 2 is brazed by a layer of hard solder 3, which covers the entire portion of the surface area of the first planar ceramic substrate 2 that faces the support element 1. On the underside of the support element 1, opposite from the ceramic substrate 2 and having the same dimensions, a second ceramic substrate 4 is likewise brazed by means of a layer of hard solder 5.

After these two brazing operations, carried out without interim cooling, a thick-film technique was used to provide the ceramic substrate 2 with conductor tracks 6, which serve for electrically connecting electrical power components 7, in this case transistors, and form a circuit with them. The electrical power components 7 are connected in a conducting manner to the conductor track 6 by means of soft solder 8, and are consequently fastened on the ceramic substrate 2.

This structural unit is connected to a housing component 9 of an aluminum diecast housing in such a way that the support element 1, which has a greater surface area extent than the ceramic substrates 2 and 4, rests flat against the housing component 9 with its regions 10 that protrude beyond the ceramic substrates 2 and 4.

Formed in the housing component 9 is a recess 11, which corresponds approximately to the dimensions of the second ceramic substrate 4 and into which the second ceramic substrate 4 protrudes.

Arranged between the regions 10 that protrude beyond the ceramic substrates 2 and 4 and the housing component 9 is a layer of thermally conductive paste 12 and between the second ceramic substrate 4 and the bottom of the recess 1 a further layer of thermally conductive paste 13.

In the regions 10, the support element 1 is securely connected to the housing component 9 by means of screws 14.

What is claimed is:

1. A power electronics unit for a control device in a motor vehicle, comprising:
    a housing having a thermally conducting housing component;
    a metal support element having first and second opposing sides;
    a first ceramic substrate having a connected side and a free side, said connected side facing said first side of said metal support element and brazed onto said first side of said metal support element;
    a circuit having conductor tracks and electrical power components arranged on said free side of said first ceramic substrate; and
    a second ceramic substrate having approximately the same dimensions as said first ceramic substrate, said second ceramic substrate having a connected side and a free side, said connected side of said second ceramic substrate facing said second side of said metal support element and brazed onto said second side of said metal support element approximately opposite said first ceramic substrate, wherein said free side of said second ceramic substrate rests flat against said housing, and wherein said thermally conducting housing component defines a recess in which said second ceramic substrate is at least partially received.

2. The power electronics unit of claim 1, wherein said metal support element is made of aluminum.

3. The power electronics unit of claim 2, further comprising a layer of thick film material on the connected sides of said first and second ceramic substrates brazed onto said metal support element and nickel plating on the free sides of said layer of thick film material.

4. The power electronics unit of claim 1, wherein said metal support element is made of copper.

5. The power electronics unit of claim 1, wherein each of said first and second ceramic substrates is made of $Al_2O_3$.

6. The power electronics unit of claim 1, wherein said thermally conducting housing component comprises a wall arranged for receiving a cooling agent.

7. The power electronics unit of claim 1, wherein said thermally conducting housing component comprises an outer wall of said housing.

8. The power electronics unit of claim 1, further comprising fastening elements connecting said metal support element to said thermally conducting housing component.

9. The power electronics unit of claim 8, wherein said fastening elements comprise threaded elements.

10. The power electronics unit of claim 1, further comprising a layer of thermally conductive paste arranged between said metal support element and said thermally conducting housing component.

11. The power electronics unit of claim 1, further comprising a layer of thermally conductive paste arranged between said second ceramic substrate and said thermally conducting housing component.

12. The power electronics unit of claim 11, further comprising another layer of thermally conductive paste arranged between said metal support element and said thermally conducting housing component.

13. The power electronics unit of claim 1, wherein said metal support element has a greater surface area than said first and second ceramic substrates and includes regions extending beyond the area between said first and second ceramic substrates, wherein said metal support element is connected to said thermally conducting housing component by said regions extending beyond the area between said first and second substrates which rest at least partially on said thermally conducting housing component.

14. The power electronics unit of claim 1, wherein said metal support element is made of pure aluminum.

15. The power electronics unit of claim 1, wherein said first and second ceramic substrates are connected to said metal support element by brazing over the entire portion of the surface area of the connected sides facing the metal support element.

16. The power electronics unit of claim 1, wherein said free side of said second ceramic substrate rests flat against said housing such that said second ceramic substrate is arranged between said metal support element and said housing.

* * * * *